United States Patent
Hessling von Heimendahl et al.

(10) Patent No.: US 9,788,457 B2
(45) Date of Patent: Oct. 10, 2017

(54) DEVICE FOR GENERATING AN AIRFLOW FOR COOLING A HEAT DISSIPATING ELECTRONIC ELEMENT SUCH AS AN LED

(71) Applicant: Goodrich Lighting Systems GmbH, Lippstadt (DE)

(72) Inventors: Andre Hessling von Heimendahl, Koblenz (DE); Anil Kumar Jha, Lippstadt (DE); Christian Schoen, Mainz (DE); Jan Frederik Hildebrandt, Lippstadt (DE); Lars Christian Schroeder, Guetersloh (DE)

(73) Assignee: GOODRICH LIGHTING SYSTEMS GMBH, Lippstadt (DE)

( * ) Notice: Subject to any disclaimer, the term of this patent is extended or adjusted under 35 U.S.C. 154(b) by 190 days.

(21) Appl. No.: 14/077,340

(22) Filed: Nov. 12, 2013

(65) Prior Publication Data

US 2014/0166235 A1  Jun. 19, 2014

(30) Foreign Application Priority Data

Dec. 13, 2012  (EP) .................................... 12197064

(51) Int. Cl.
*H05K 7/20* (2006.01)
*F04D 33/00* (2006.01)

(52) U.S. Cl.
CPC ......... *H05K 7/20145* (2013.01); *F04D 33/00* (2013.01); *B64D 2203/00* (2013.01)

(58) Field of Classification Search
CPC ........ F04D 27/00; F04D 27/004; F04D 33/00; H05K 7/20209; F28F 5/00; F28F 5/04;
(Continued)

(56) References Cited

U.S. PATENT DOCUMENTS 4,063,826 A * 12/1977 Riepe ...................... F04D 33/00
                                                            417/410.1
4,512,933 A *  4/1985 Harden ..................... A61L 9/122
                                                             239/326

(Continued)

FOREIGN PATENT DOCUMENTS

WO        8002445 A1    11/1980

OTHER PUBLICATIONS

European Search Report for Application No. 12197064.4-1607. Mailed on Jun. 5, 2013. 5 pages.

*Primary Examiner* — Charles Freay
*Assistant Examiner* — Kenneth J Hansen
(74) *Attorney, Agent, or Firm* — Cantor Colburn LLP

(57) ABSTRACT

The device for generating an air flow for cooling a heat dissipating electronic element such as an LED comprises a channel (12,56) extending between an inlet portion (18) upstream of the air flow to be generated and an outlet portion (20) downstream of the air flow to be generated, wherein the channel (12,56) comprises at least two substantially opposite side surfaces (14). Moreover, the device is provided with a first bendable air ventilating blade (10,58) arranged within the channel (12,56) and having an overall longitudinal extension substantially coinciding with the extension of the channel (12,56), with a first longitudinal end (24,62) arranged upstream of the air ventilating blade (10,58) flow to be generated and a second end (28,70) arranged downstream of the air flow to be generated. The first air ventilating blade (10,58) with its first end (24,62) is fixedly arranged and has its second end (28,70) is reciprocatingly arranged. Furthermore, the device comprises a driving means (32,34,36,66,68) for reciprocating the second end (28,70) of the air ventilating blade (10,58) in a direction (Continued)

between the two substantially opposite side surfaces of the channel (12,56).

11 Claims, 3 Drawing Sheets

(58) Field of Classification Search
CPC ... F28F 5/06; F28F 3/027; F28F 13/06; F28D 11/00
USPC ...... 417/44.11, 436; 362/373, 294, 264, 547
See application file for complete search history.

(56) References Cited

U.S. PATENT DOCUMENTS

| | | | | |
|---|---|---|---|---|
| 4,780,062 A * | 10/1988 | Yamada | .................. | F04D 33/00 310/316.01 |
| 4,923,000 A * | 5/1990 | Nelson | .................... | F04D 33/00 165/122 |
| 5,008,582 A * | 4/1991 | Tanuma | ................. | H01L 23/467 257/E23.099 |
| 5,861,703 A * | 1/1999 | Losinski | ................. | F04D 33/00 257/E23.099 |
| 5,941,694 A * | 8/1999 | Tsutsui | .................... | F04D 33/00 417/410.2 |
| 6,043,978 A * | 3/2000 | Mody | ...................... | H01H 9/52 165/185 |
| 6,713,942 B2 * | 3/2004 | Raman | ................... | H01L 41/08 310/311 |
| 7,031,155 B2 * | 4/2006 | Sauciuc | ................. | F04D 33/00 257/722 |
| 7,061,161 B2 * | 6/2006 | Scher | ................. | H01L 41/0993 310/328 |
| 7,204,615 B2 * | 4/2007 | Arik | ........................ | F21V 29/02 257/E23.098 |
| 7,248,475 B2 * | 7/2007 | Paydar | .................. | F04D 29/582 165/104.33 |
| 7,543,961 B2 * | 6/2009 | Arik | ........................ | F21V 29/02 362/294 |
| 7,619,894 B2 * | 11/2009 | Wang | .................... | F04D 29/582 165/122 |
| 7,621,725 B2 * | 11/2009 | Huang | .................... | F04D 33/00 416/146 R |
| 7,638,928 B2 * | 12/2009 | Palanduz | ................ | F04D 33/00 310/311 |
| 7,692,922 B2 * | 4/2010 | Leija | .................... | H01L 23/467 165/185 |
| 8,081,454 B2 * | 12/2011 | Ishikawa | ................... | F04F 7/00 165/122 |
| 8,322,889 B2 * | 12/2012 | Petroski | ................. | F04D 33/00 361/694 |
| 8,581,471 B2 * | 11/2013 | Tanaka | .................... | F04D 33/00 165/121 |
| 8,681,496 B2 * | 3/2014 | Dede | .................. | H05K 7/20172 361/679.48 |
| 9,140,502 B2 * | 9/2015 | Kaslusky | ................. | F28F 13/06 |
| 2004/0005222 A1* | 1/2004 | Yoshida | ................ | F04B 35/045 417/44.11 |
| 2007/0182286 A1* | 8/2007 | Scher | .................. | H01L 41/0993 310/328 |
| 2008/0062644 A1* | 3/2008 | Petroski | ................. | F04D 33/00 361/695 |
| 2011/0068658 A1* | 3/2011 | Kamitani | ................ | F04D 27/00 310/316.01 |
| 2012/0048522 A1* | 3/2012 | Hessling | ................. | F21V 29/02 165/120 |

* cited by examiner

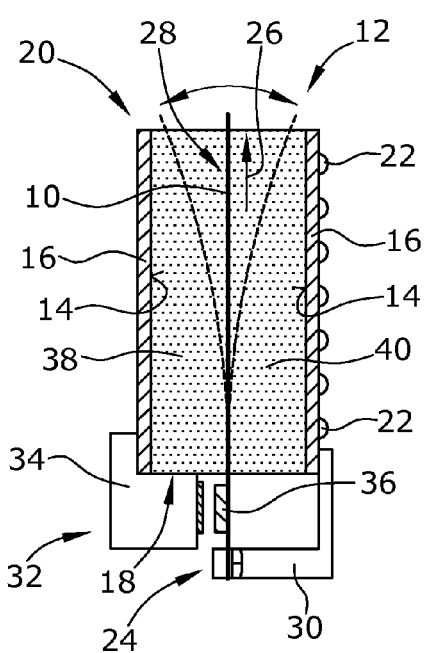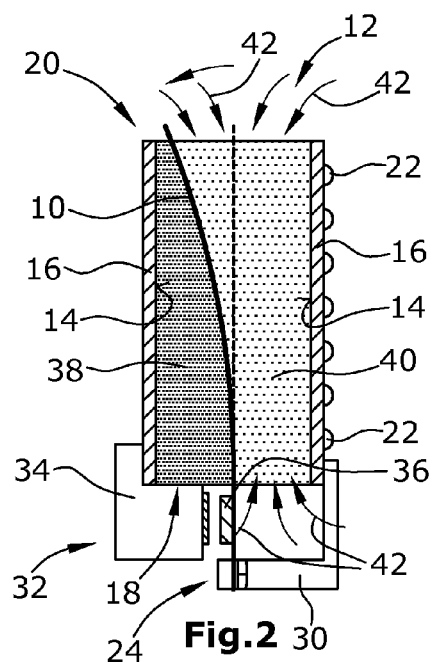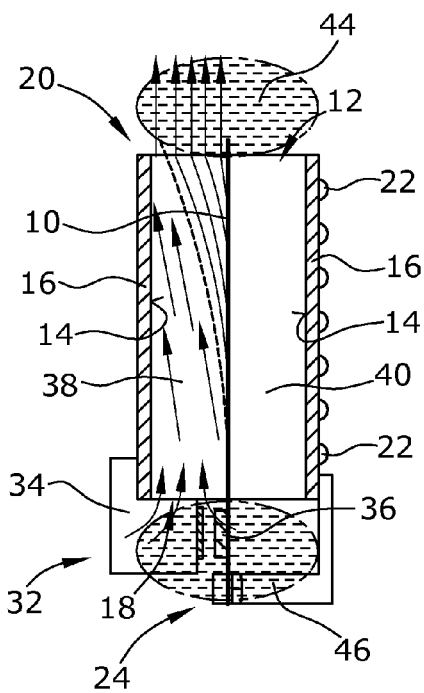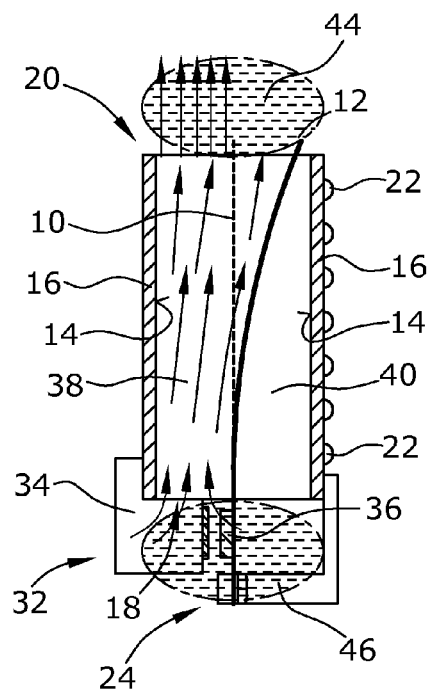

US 9,788,457 B2

DEVICE FOR GENERATING AN AIRFLOW FOR COOLING A HEAT DISSIPATING ELECTRONIC ELEMENT SUCH AS AN LED

RELATED APPLICATIONS/PRIORITY CLAIM

This application claims priority to European Patent Application No. 12 197 064.4 filed on Dec. 13, 2012, and which is hereby incorporated by reference in its entirety.

FIELD OF INVENTION

The present invention relates to a device for generating an airflow for cooling a heat dissipating electronic element such as an LED.

DESCRIPTION OF RELATED ART

Electronic elements and in particular high performance electronic elements generate heat and need to be cooled during operation in order to avoid damage to the electronic elements. For example, in a vehicle light having LED light sources it is necessary to cool the LEDs. Examples for such lights are e.g. exterior lights for aircraft like e.g. landing and take-off-lights or anti-collision aircraft lights. The cooling concepts currently used are based on heat dissipating cooling elements or so-called heat sinks with increased surface portions for transferring heat to the airstream or environment flowing along and surrounding the cooling element. For cooling purposes it would be much more effective to use active, e.g., forced cooling means. However, currently in the aircraft industry all types of forced cooling means are prohibited at major customers, e.g. airlines, due to anticipated significant reduction of reliability. Furthermore, the forced cooling means are not designed for most severe conditions e.g. on landing gear when exposed to aggressive fluids, dirt, stone chipping, ice, and vibrations.

One example of a forced cooling means for an aircraft light or other electric, electrooptic or electronic arrangement is disclosed in US-A-2012/0048522 and EP-A-2 426 409.

Accordingly, there is a need in the prior art for forced cooling means having increased reliability during the lifetime of the cooling means.

BRIEF SUMMARY

According to one aspect of the invention, provided is a device for generating an air flow for cooling a heat dissipating electronic element such as an LED. The device includes a channel extending between an inlet portion upstream of the air flow to be generated and an outlet portion downstream of the air flow to be generated. The channel comprises at least two substantially opposite side surfaces, a first bendable air ventilating blade arranged within the channel and having an overall longitudinal extension substantially coinciding with the extension of the channel, with a first longitudinal end upstream of the air ventilating blade flow to be generated and a second end arranged downstream of the air flow to be generated. The first air ventilating blade has its first end fixedly arranged and has its second end reciprocatingly arranged. The device also includes driving means for reciprocating the second end of the air ventilating blade in a direction between the two substantially opposite side surfaces of the channel.

In one embodiment, an embodiment includes a channel extending between an inlet portion upstream of the airflow to be generated and an outlet portion downstream of the airflow to be generated.

Such a channel for example can be defined between two adjacent cooling fins of a cooling element. The channel comprises at least two substantially opposite side surfaces which may be defined by two cooling fins. Between the two opposite side surfaces a first bendable air ventilating blade or sheet is arranged. The blade can be made from metal or plastics or other materials. The air ventilating blade has a longitudinal extension which substantially coincides with the extension of the channel. A first longitudinal end of the air ventilating blade is arranged upstream of the airflow and is fixedly arranged, while a second end of the air ventilating blade is arranged downstream of the airflow and is reciprocatingly arranged. Accordingly, the air ventilating blade at its second end can reciprocate, e.g. can vibrate or oscillate with the aid of a driving means.

The driving means can operate mechanically, electrically or electromagnetically. In the electromagnetic embodiment, no moving driving parts are necessary.

In one embodiment, the device operates based on the following physical concept. The air ventilating blade separates the channel into two chambers. When the reciprocatingly arranged second end of the air ventilating blade moves towards the first chamber, the air in this first chamber is compressed while the air in the second chamber is expanded. Accordingly, air from the surrounding is sucked into the second chamber. When thereafter the second end of the air ventilating blade is moved in the reverse direction, i.e. towards the second chamber, the air of the second chamber is pushed at high velocity creating low pressure at one end of the chamber so that air again is sucked towards the low pressure zone. This effect is supported by using an air flow in the direction of natural convection. Accordingly, the device of the invention should be arranged such that the channel extends vertically with the fixed first longitudinal end of the air ventilating blade arranged at a lower level than the reciprocating second end of the air ventilating blade.

According to the invention one or more channels can be provided wherein in each channel at least one air ventilating blade is arranged. All the air ventilating blades can be driven reciprocatingly by the driving means or by individual driving units.

According to another aspect of the present invention, the at least one channel can be provided with several air ventilating blades which can be arranged side-by-side or can be arranged one behind the other in the direction of the extension of the channel. When arranged side-by-side, two adjacent air ventilating blades can be reciprocate inversely. In case that the air ventilating blades of a channel of the device according to the invention are arranged one behind the other, the driving means can be adapted to reciprocate respectively adjacent air ventilation blades synchronously or inversely.

According to a further aspect of the present invention, the device may comprise several groups of air ventilating blades with each group comprising at least two air ventilating blades arranged side-by-side to each other and with the groups of air ventilating blades being arranged upstream or downstream of one another, wherein the driving means is adapted to inversely reciprocate, within each group, the air ventilating blades of a respective pair of adjacent air 20 ventilating blades. In this embodiment, the driving means may be further adapted to reciprocate those air ventilating blades of all the groups which are arranged along the extension of the channel, respectively, in a synchronous manner or inversely.

The present invention can be used in particular in a high performance aircraft light using high intensity LEDs such as an aircraft head lamp or an aircraft beacon or strobe light or in another type of anti-collision light. As mentioned above, the present invention describes a way of how to provide a highly reliable forced cooling device for a heat dissipating electronic element. The cooling device according to the invention is sufficiently robust to be mounted e.g. on a nose landing gear or on top of an aircraft. In electronic components and, in particular, in LEDs the performance and reliability over the lifetime both degrade due to increase in temperature. In LEDs it is particularly the junction temperature of the diode. Accordingly, it is necessary to cool the electronic component in order to operate it at maximum power; this is true in particular for LEDs. Heat can be transferred rapidly from the electronic component to heat sink fins depending on thermal conductivity of heat sink material such as copper, aluminum, heat pipes etc. However, heat transfer rates from the heat sink to the environment are rather slow due to natural convection. Therefore it is necessary to introduce forced convection. However, the problem with the currently available forced convection methods such as by using fans is that these devices, due to their moving mechanical parts, have very little lifetime compared to LEDs. Also the mechanical forced convection devices are unpopular due to undesirable noise. The invention solves both issues. The lifetime issue can be overcome according to the invention due to the mechanical stress on the oscillating air ventilating blade being kept below its fatigue endurance limit so that the lifetime basically is infinite. The problem of noise is also solved by the present invention in that the frequency at which the air ventilating blade oscillates, is below the human audible range.

A specific method for controlling the air ventilating blade(s) in order to 20 reciprocate at the respective resonance frequency including the possibility of tracing potential variations of the resonance frequency is described in European patent application 12 197 053.7 filed on Dec. 13, 2012, the disclosure of which is incorporated herewith by reference.

Other aspects, features, and techniques of the invention will become more apparent from the following description taken in conjunction with the drawings.

BRIEF DESCRIPTION OF THE SEVERAL VIEWS OF THE DRAWINGS

A full and enabling disclosure of the present invention, enabling one of ordinary skill in the art to carry out in invention, is set forth in greater detail in the following description, including reference to the accompanying drawing in which:

FIGS. 1 to 4 schematically illustrate the concept of how an air flow can be created in a channel by means of a oscillating air ventilating blade;

DETAILED DESCRIPTION

Figure 5:
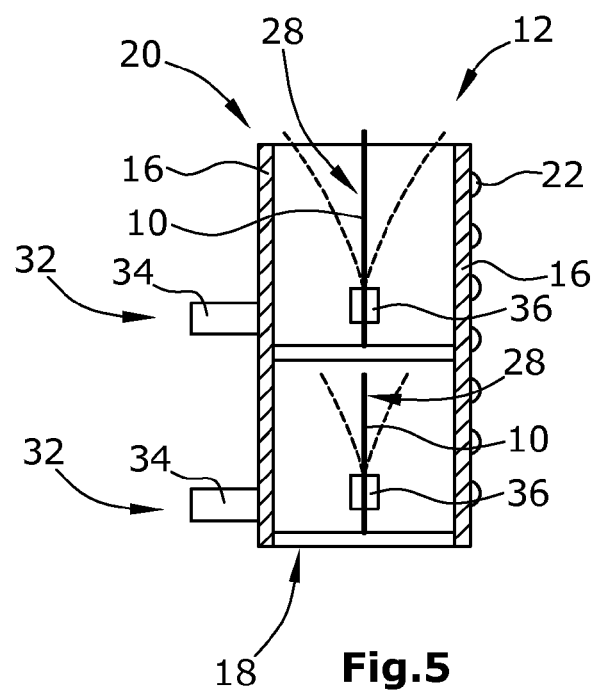
FIGS. 5 and 6 show two further embodiments of how several air ventilating blades can be arranged one behind the other or side-by-side within a channel.

The drawing figures are intended to illustrate the general manner of construction and are not necessarily to scale. In the detailed description and in the drawing figures specific illustrative examples are shown and herein described in detail. It should be understood, however, that the drawing figures and detailed description are not intended to limit the invention to the particular form disclosed, but are merely illustrative and intended to teach one of ordinary skill how to make and /or use the invention claimed herein.

Based on FIGS. 1 to 4 the principle of the present invention will be described in detail. In this embodiment for reciprocating an air ventilating blade, electromagnetic energy is used. However, other mechanisms for oscillating an air ventilating blade can be used according to the invention.

In the embodiment of FIGS. 1 to 4, an oscillation air ventilating blade 10 is arranged within a channel 12 limited by two substantially opposite side surfaces 14, e.g. formed as inner surfaces of two cooling fins of a heat sink (not shown in FIGS. 1 to 4) forming sidewalls 16 of the channel. The channel 12 can be closed at all of its lateral sides and extends between an inlet portion 18 and an outlet portion. As schematically shown in FIGS. 1 to 4, several LEDs 22 are mounted at one of the sidewalls 16 and can be cooled via this sidewall 16. Preferably the sidewalls 16 are made from heat conductive material. The air ventilating blade 10 has an overall longitudinal extension and is orientated and arranged within channel 12 such that both are extending substantially in 10 the same direction. The air ventilating blade 10 has a first longitudinal end 24 arranged upstream of an airflow (see arrow 26) to be generated. Moreover, the air ventilating blade 10 is provided with a second longitudinal end 28 arranged downstream of the airflow to be generated. At its first end 24, the air ventilating blade 10 is fixed at a support or holding element 30.

The air ventilating blade 10 can be made of any suitable material which is bendable, resilient and/ or elastic. A preferred material may be metal. However, also plastics can be used for the air ventilating blade 10.

Moreover, the device according to FIGS. 1 to 4 is also provided with a drive means 32 which, in this embodiment, is provided with an electrically controlled solenoid 34 generating the periodically chancing magnetic field for reciprocating the air ventilating blade at its second end 28. The air ventilating blade 10, in this embodiment, is provided with a permanent magnet 36 which is arranged close to the first fixed longitudinal end 24 of the air ventilating blade 10. If the material, from which the air ventilating blade 10 is made, has permanent magnetic properties, providing a separate additional permanent magnet 36 might not be necessary. However, providing a permanent magnet 36 is advantageous in that an optimum push-pull-effect on the air ventilating blade 10 can be generated at low electrical power. Mechanical stress on the air ventilating blade 10 should be kept as little as possible so that the air ventilating blade 10 oscillates and reciprocates below its fatigue endurance limit to get substantially infinite lifetime. Also the air ventilating blade 10 should reciprocate at its resonance frequency to minimize power requirement. The strengths of the permanent magnet 36 and the solenoid 34 both define the amplitude of the oscillating second end 28 of the air vibrating blade 10. Higher amplitudes generate higher air flows and, accordingly, higher cooling rates. Elastic properties of the air ventilating blade 10 are utilized for its oscillation so that wear and tear of the cooling parts is eliminated.

In order to further support the generation of an airflow in the direction of arrow 26, the channel 12 extends in the direction of natural convention, i.e. is orientated substantial vertically. The air ventilating blade 10 separates the volume defined by the channel 12 into two chambers, namely into a first 15 chamber 38 and a second chamber 40. When the reciprocating second end 28 of the air ventilating blade 10 moves from its neutral position towards the first chamber 38, most of the air in the first chamber 38 is compressed and moves in any direction while at the same time the air in the second chamber 40 expands and, accordingly, sucks in air from the surroundings. This is shown in FIG. 2 by arrows 42. When the air ventilating blade 10 turns back (see FIG. 3), the expanded air in the second chamber 40 slides along with the air ventilating blade 10 and is pushed upwards towards and beyond the second end 28 of the air ventilating blade 10 at high velocity which creates a low pressure zone 44 at the outlet portion 20 of the channel 12. Therefore, the compressed air in the first chamber 38 also streams upwards towards the low pressure zone 44. Compared to the low pressure zone 44 at the outlet portion of the channel 12, the channel 12 at its inlet portion 18 is surrounded by a relatively high pressure zone 46. Due to this pressure zone 46, air flows into the first chamber 38.

After having passed its neutral position, the air ventilation blade 10 moves towards the second chamber 40 and the air in the second chamber 40 is compressed. Accordingly, the same physical process as described before for the first chamber 38 now starts in the second chamber 40. When the cycle repeats, the velocity of the air that is pushed upwards does not allow air to move downwards when air is sucked in from the surroundings during air expansion due to the air ventilating blade 10 moving away from the sidewalls 16. Accordingly, air is merely sucked in from the lower side of the channel 12, i.e. from the inlet portion 18, and is pushed upwards towards and out of the outlet portion 20 of the channel 12.

Figure 6:
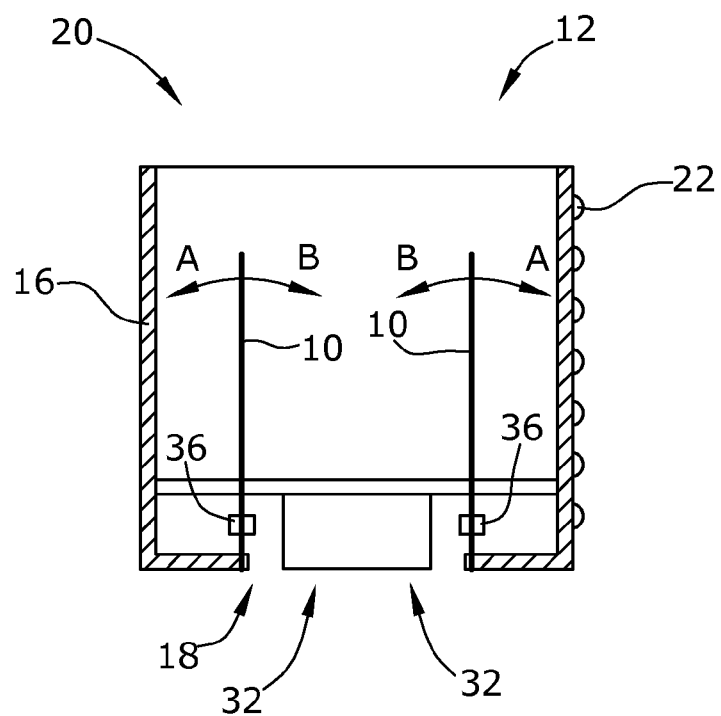

In FIGS. 5 and 6 two additional alternative embodiments are schematically shown wherein alike parts of the devices shown in FIGS. 1 to 6 are designated with like reference numerals, respectively.

In the embodiment according to FIG. 5, within the channel 12 there are arranged two air ventilating blades 10 which blades are arranged one behind the other. The drive means 32, due to magnetic influences, drive two air ventilating blades 10 so that they reciprocate at their respective second ends 28. The reciprocation movement of the two air ventilating blades 10 can be 20 synchronous or inverse. In FIG. 6, within the channel 12 there are arranged again two air ventilating blades 10 which are arranged side-by-side. The drive means 32 causes the two air ventilating blades 10 to reciprocate inversely. This is shown in FIG. 6 by the arrows A and B.

Figure 7:
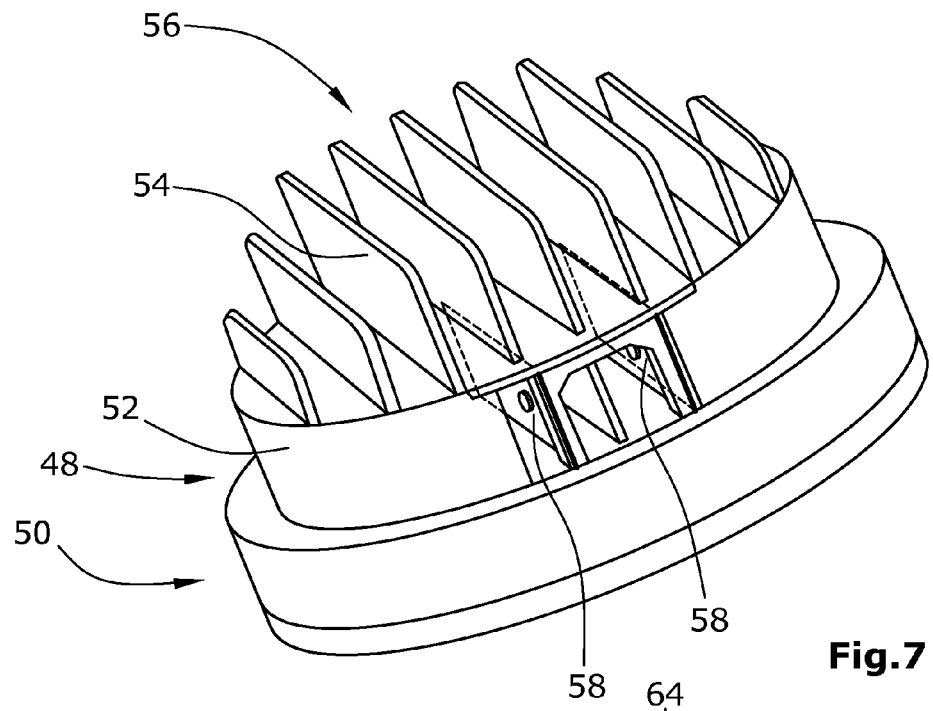
FIG. 7 shows a perspective view of a heat sink of an aircraft head light with LEDs (high performance LEDs) cooled by the heat sink which is provided in the device for generating an active airflow between adjacent heat sink fins.
Figure 8:
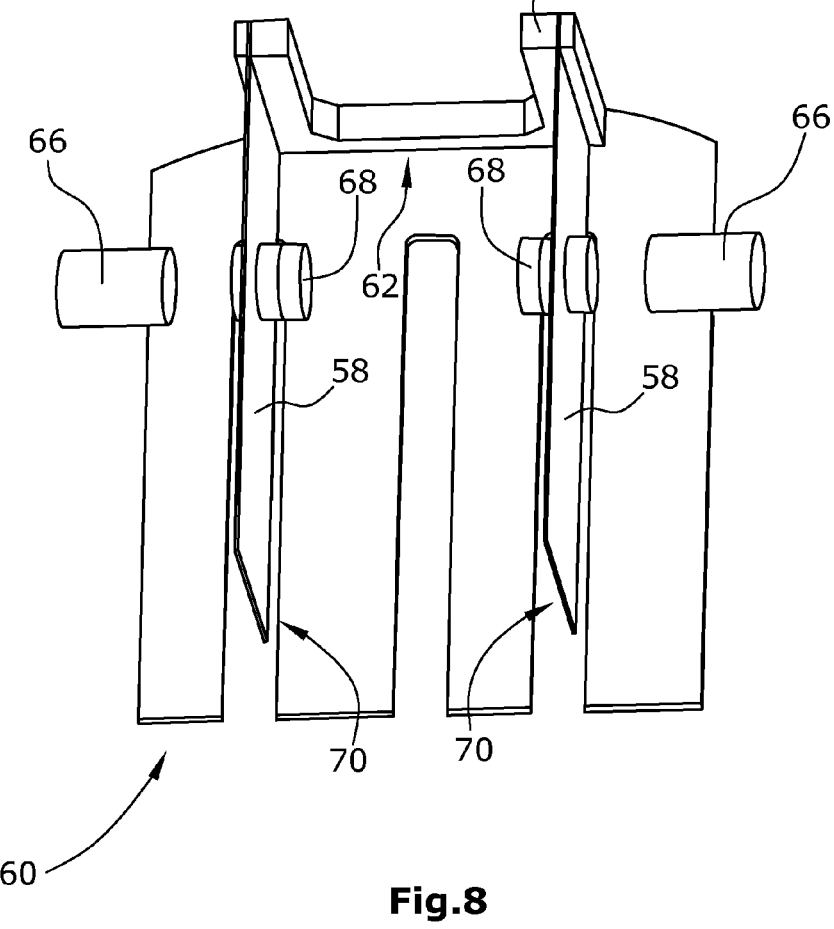
FIG. 8 shows a component of the heat sink according to FIG. 7 wherein the 15 component is provided with two air ventilation blades arranged in adjacent channels between the heat sink fins.

In FIG. 7 the heat sink 48 of an aircraft light 50 is shown. The sink 48 comprises the cooling body 52 having several cooling fins 54. Between adjacent cooling fins 54, channels 56 are formed wherein air ventilating blades 58 are located within two adjacent channels. In this embodiment, the air ventilating blades 58 are arranged in alignment with the cooling fins 54 which 30 have respective cut-out portions for accommodating the air ventilating blades 58. FIG. 8 shows a mounting element 60 carrying the two air ventilating blades 58 fixedly mounted at their respective first ends 62 by means of a bracket 64. Reference numerals 66 designate drive means which, in this embodiment, again are formed as solenoids for magnetically coupling with permanent magnets 68 at the air ventilating blades 58. The air ventilating blades 58 again can oscillate and reciprocate at their second ends 70 as described before.

Although the invention has been described and illustrated with reference to specific illustrative thereof, it is not intended that the invention be limited to those illustrative embodiment. Those skilled in the art will recognize that variations and modifications can be made without departing from the true scope of the invention as defined by the claims that follow. It is therefore intended to include within the invention all such variations and modifications as fall within the scope of the appended claims and equivalents thereof.

The invention claimed is:

1. An aircraft light, comprising:
   an LED,
   a cooling body having several cooling fins, the LED being in a heat transfer arrangement with said cooling fins, and
   a device for generating an air flow for cooling the LED, the device for generating the air flow comprising:
      a channel extending between an inlet portion upstream of the air flow to be generated and an outlet portion downstream of the air flow to be generated, wherein the channel comprises at least two substantially opposite side surfaces, with the at least two substantially opposite side surfaces being formed by said cooling fins;
      a first bendable air ventilating blade arranged within the channel and having an overall longitudinal extension substantially coinciding with the extension of the channel, with a first longitudinal end arranged upstream of the air ventilating blade flow to be generated and a second end arranged downstream of the air flow to be generated, wherein the first air ventilating blade has its first end fixedly arranged and has its second end reciprocatingly arranged, wherein the channel extends vertically with the first end of the first ventilating blade being arranged at a lower level than the second end of the first ventilating blade;
      driving means for reciprocating the second end of the air ventilating blade in a direction between the two substantially opposite side surfaces of the channel; and
      at least a second air ventilating blade arranged within the channel beside the first air ventilating blade, wherein the first air ventilating blade and the second air ventilating blade are immediately adjacent each other and wherein the driving means is adapted to inversely reciprocate the air ventilating blades of a respective pair of adjacent air ventilating blades.

2. The aircraft light according to claim 1, wherein the device for generating air flow further comprises more than one channel each provided with a first air ventilating blade, wherein the first air ventilating blades are driven reciprocatingly with the aid of the driving means.

3. The aircraft light according to claim 1, wherein the device for generating air flow further comprises at least a third air ventilating blade arranged downstream or upstream of the first air ventilating blade, wherein the driving means is adapted to reciprocate the first and third air ventilating blades.

4. The aircraft light according to claim 3, wherein the device for generating air flow further comprises several groups of air ventilating blades, with each group comprising at least two air ventilating blades arranged side-by-side to each other and with the groups of air ventilating blades being arranged upstream or downstream of one another, wherein the driving means is adapted to inversely reciprocate, within each group, the air ventilating blades of a respective pair of adjacent air ventilating blades.

5. The aircraft light according to claim 1, wherein the device for generating air flow further comprises several groups of air ventilating blades, with each group comprising at least two air ventilating blades arranged side-by-side to each other and with the groups of air ventilating blades being arranged upstream or downstream of one another, wherein the driving means is adapted to inversely reciprocate, within each group, the air ventilating blades of a respective pair of adjacent air ventilating blades.

6. The aircraft light according to claim 1, wherein the driving means comprises a generating means for generating a periodically changing magnetic field for reciprocating the air ventilating blade or air ventilating blades via interacting magnetic forces within the magnetic field.

7. The aircraft light according to claim 2, wherein the driving means comprises a generating means for generating a periodically changing magnetic field for reciprocating the air ventilating blade or air ventilating blades via interacting magnetic forces within the magnetic field.

8. The aircraft light according to claim 3, wherein the driving means comprises a generating means for generating a periodically changing magnetic field for reciprocating the air ventilating blade or air ventilating blades via interacting magnetic forces within the magnetic field.

9. The aircraft light according to claim 1, wherein the air ventilating blade or each air ventilating blade is resilient and/or elastic.

10. The aircraft light according to claim 2, wherein the air ventilating blade or each air ventilating blade is resilient and/or elastic.

11. The aircraft light according to claim 3, wherein the air ventilating blade or each air ventilating blade is resilient and/or elastic.

* * * * *